(12) United States Patent
Nam et al.

(10) Patent No.: US 9,412,720 B2
(45) Date of Patent: Aug. 9, 2016

(54) SEMICONDUCTOR PACKAGE HAVING SUPPORTING PLATE AND METHOD OF FORMING THE SAME

(71) Applicants: Tae-Duk Nam, Seoul (KR); Jin-Ho Kim, Cheonan-si (KR); Hyuk-Su Kim, Daejeon (KR); Hyoung-Suk Kim, Cheonan-si (KR); Tae-Young Lee, Incheon (KR)

(72) Inventors: Tae-Duk Nam, Seoul (KR); Jin-Ho Kim, Cheonan-si (KR); Hyuk-Su Kim, Daejeon (KR); Hyoung-Suk Kim, Cheonan-si (KR); Tae-Young Lee, Incheon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/184,951

(22) Filed: Feb. 20, 2014

(65) Prior Publication Data

US 2014/0167291 A1    Jun. 19, 2014

Related U.S. Application Data

(63) Continuation of application No. 13/564,309, filed on Aug. 1, 2012, now Pat. No. 8,674,494.

(30) Foreign Application Priority Data

Aug. 31, 2011   (KR) .......................... 10-2011-0088094

(51) Int. Cl.
*H01L 25/065* (2006.01)
*H01L 25/00* (2006.01)
(Continued)

(52) U.S. Cl.
CPC ............ *H01L 25/0657* (2013.01); *H01L 24/97* (2013.01); *H01L 25/50* (2013.01);
(Continued)

(58) Field of Classification Search
CPC . H01L 23/3121; H01L 25/0657; H01L 25/50; H01L 24/97
USPC ................... 257/777, 737, 738, 783, 686, 314
See application file for complete search history.

(56) References Cited

U.S. PATENT DOCUMENTS 3,105,869 A    10/1963   Branch et al.
3,501,681 A     3/1970   Weir
(Continued)

FOREIGN PATENT DOCUMENTS

EP    1 248 295 A2    10/2002
FR    2 688 628         9/1993
(Continued)

OTHER PUBLICATIONS

Howell et al: "Are Array Solder Interconnection Technology for the Three-Dimensional Silicon Cube", Proceedings of the 1995 45th Electronic Components & Technology Conference, pp. 1174-1178.
(Continued)

*Primary Examiner* — Mohammad Islam
*Assistant Examiner* — Christina Sylvia
(74) *Attorney, Agent, or Firm* — Myers Bigel & Sibley, P.A.

(57) ABSTRACT

A semiconductor package may include a packaging substrate, a first semiconductor chip on the packaging substrate, and a support plate on the packaging substrate. The support plate may be spaced apart from the first semiconductor chip in a direction parallel with respect to a surface of the packaging substrate. A second semiconductor chip may be provided on the first semiconductor chip and on the support plate so that the first semiconductor chip is between the second semiconductor chip and the packaging substrate and so that the support plate is between the second semiconductor chip and the packaging substrate. An adhesion layer may bond the second semiconductor chip to the first semiconductor chip and may bond the second semiconductor chip to the support plate. In addition, an electrical coupling may be provided between the first semiconductor chip and the packaging substrate.

16 Claims, 17 Drawing Sheets

(51) Int. Cl.
H01L 23/31 (2006.01)
H01L 23/00 (2006.01)
H01L 25/18 (2006.01)

(52) U.S. Cl.
CPC ............ H01L23/3128 (2013.01); H01L 24/16 (2013.01); H01L 24/29 (2013.01); H01L 24/32 (2013.01); H01L 24/45 (2013.01); H01L 24/48 (2013.01); H01L 24/73 (2013.01); H01L 25/18 (2013.01); H01L 2224/131 (2013.01); H01L 2224/16145 (2013.01); H01L 2224/16225 (2013.01); H01L 2224/16265 (2013.01); H01L 2224/291 (2013.01); H01L 2224/2919 (2013.01); H01L 2224/32145 (2013.01); H01L 2224/32225 (2013.01); H01L 2224/32265 (2013.01); H01L 2224/45124 (2013.01); H01L 2224/45144 (2013.01); H01L 2224/48091 (2013.01); H01L 2224/48145 (2013.01); H01L 2224/48227 (2013.01); H01L 2224/73204 (2013.01); H01L 2224/73253 (2013.01); H01L 2224/73265 (2013.01); H01L 2224/97 (2013.01); H01L 2225/0651 (2013.01); H01L 2225/06506 (2013.01); H01L 2225/06513 (2013.01); H01L 2225/06517 (2013.01); H01L 2225/06541 (2013.01); H01L 2225/06562 (2013.01); H01L 2924/01013 (2013.01); H01L 2924/1434 (2013.01); H01L 2924/1436 (2013.01); H01L 2924/1437 (2013.01); H01L 2924/15311 (2013.01); H01L 2924/181 (2013.01); H01L 2924/19041 (2013.01); H01L 2924/19042 (2013.01); H01L 2924/19043 (2013.01); H01L 2924/19103 (2013.01); H01L 2924/19105 (2013.01)

(56) References Cited

U.S. PATENT DOCUMENTS

| | | | |
|---|---|---|---|
| 3,663,184 A | 5/1972 | Wood et al. | |
| 3,760,238 A | 9/1973 | Hammer et al. | |
| 3,770,874 A | 11/1973 | Krieger et al. | |
| 3,871,014 A | 3/1975 | King et al. | |
| 3,897,871 A | 8/1975 | Zimnbauer | |
| 3,942,187 A | 3/1976 | Gelsing et al. | |
| 4,074,342 A | 2/1978 | Honn et al. | |
| 4,113,578 A | 9/1978 | Del Monte | |
| 4,382,517 A | 5/1983 | Welsch | |
| 4,473,263 A | 9/1984 | Sunstein | |
| 4,532,576 A | 7/1985 | Reimer | |
| 4,657,146 A | 4/1987 | Walters | |
| 4,855,809 A | 8/1989 | Malhi et al. | |
| 4,948,754 A | 8/1990 | Kondo et al. | |
| 4,950,623 A | 8/1990 | Dishon | |
| 4,962,058 A | 10/1990 | Cronin et al. | |
| 5,022,580 A | 6/1991 | Pedder | |
| 5,113,314 A | 5/1992 | Wheeler et al. | |
| 5,160,409 A | 11/1992 | Moore et al. | |
| 5,162,257 A | 11/1992 | Yung | |
| 5,194,137 A | 3/1993 | Moore et al. | |
| 5,239,447 A | 8/1993 | Cotues et al. | |
| 5,240,881 A | 8/1993 | Cayetano et al. | |
| 5,250,843 A | 10/1993 | Eichelberger | |
| 5,289,925 A | 3/1994 | Newmark | |
| 5,293,006 A | 3/1994 | Yung | |
| 5,327,013 A | 7/1994 | Moore et al. | |
| 5,327,327 A | 7/1994 | Frew et al. | |
| 5,335,795 A | 8/1994 | Chizen | |
| 5,347,428 A | 9/1994 | Carson et al. | |
| 5,354,711 A | 10/1994 | Heitzmann et al. | |
| 5,406,701 A | 4/1995 | Pepe et al. | |
| 5,424,920 A | 6/1995 | Miyake | |
| 5,432,729 A | 7/1995 | Carson et al. | |
| 5,453,582 A | 9/1995 | Amano et al. | |
| 5,616,962 A | 4/1997 | Ishikawa et al. | |
| 5,680,296 A | 10/1997 | Hileman et al. | |
| 5,739,053 A | 4/1998 | Kawakita et al. | |
| 5,744,382 A | 4/1998 | Kitayama et al. | |
| 5,751,556 A | 5/1998 | Butler et al. | |
| 5,760,478 A | 6/1998 | Bozso et al. | |
| 5,793,116 A | 8/1998 | Rinne et al. | |
| 5,963,793 A | 10/1999 | Rinne et al. | |
| 5,977,640 A | 11/1999 | Bertin et al. | |
| 6,082,610 A | 7/2000 | Shangguan et al. | |
| 6,340,846 B1 | 1/2002 | LoBianco et al. | |
| 6,369,448 B1 | 4/2002 | McCormick | |
| 6,388,313 B1* | 5/2002 | Lee | H01L 23/3128 257/686 |
| 6,388,333 B1 | 5/2002 | Taniguchi et al. | |
| 6,392,292 B1 | 5/2002 | Morishita | |
| 6,452,260 B1 | 9/2002 | Corbin et al. | |
| 6,563,205 B1 | 5/2003 | Fogal et al. | |
| 6,621,155 B1 | 9/2003 | Perino et al. | |
| 6,627,980 B2 | 9/2003 | Eldridge | |
| 6,731,009 B1 | 5/2004 | Jones et al. | |
| 6,768,208 B2 | 7/2004 | Lin et al. | |
| 6,900,528 B2 | 5/2005 | Mess et al. | |
| 7,179,686 B2 | 2/2007 | Ichikawa | |
| 7,437,497 B2* | 10/2008 | Cornelius | G11C 7/1078 711/101 |
| 7,459,776 B1* | 12/2008 | St. Amand | H01L 25/0657 257/685 |
| 7,495,326 B2 | 2/2009 | Rinne | |
| 7,859,119 B1 | 12/2010 | St. Amand et al. | |
| 8,254,155 B1* | 8/2012 | Crisp et al. | 365/63 |
| 2002/0005577 A1 | 1/2002 | Shimoda | |
| 2002/0079567 A1 | 6/2002 | Lo et al. | |
| 2003/0122240 A1 | 7/2003 | Lin et al. | |
| 2005/0146010 A1 | 7/2005 | Moden et al. | |
| 2006/0126369 A1 | 6/2006 | Raghuram | |
| 2008/0128880 A1* | 6/2008 | Takiar et al. | 257/686 |
| 2009/0014860 A1* | 1/2009 | Liu | H01L 25/0652 257/686 |
| 2010/0109153 A1* | 5/2010 | Setiadi | H01L 23/3128 257/713 |
| 2010/0117244 A1* | 5/2010 | Miyagawa | H01L 25/0652 257/778 |
| 2010/0314740 A1* | 12/2010 | Choi | H01L 23/3121 257/686 |
| 2011/0175222 A1* | 7/2011 | Kim | H01L 23/16 257/738 |
| 2013/0049228 A1* | 2/2013 | Nam | H01L 24/97 257/777 |
| 2015/0021761 A1* | 1/2015 | Park | H01L 23/522 257/737 |

FOREIGN PATENT DOCUMENTS

| | | |
|---|---|---|
| JP | 55-111127 | 8/1980 |
| JP | 57-73952 | 5/1982 |
| JP | 57-197838 | 12/1982 |
| JP | 58-92230 | 6/1983 |
| JP | 59-154041 | 9/1984 |
| JP | 6-116552 | 1/1986 |
| JP | 63-222245 | 9/1988 |
| JP | 63-222445 | 9/1988 |
| JP | 4-150033 | 5/1992 |
| JP | 2005-150459 | 6/2005 |
| JP | 3776427 | 5/2006 |
| JP | 2009-026843 | 2/2009 |
| KR | 10-2001-0023575 A | 3/2001 |
| KR | 10-2010-0134354 A | 12/2010 |

OTHER PUBLICATIONS

Lineback, "3DIC Packaging Moves Closer to Commercial Use", Electronic World News, May 21, 1990, p. 15.

* cited by examiner

US 9,412,720 B2

SEMICONDUCTOR PACKAGE HAVING SUPPORTING PLATE AND METHOD OF FORMING THE SAME

CROSS-REFERENCE TO RELATED APPLICATION

This application claims priority as a continuation of U.S. application Ser. No. 13/564,309 filed Aug. 1, 2012, which claims priority under 35 U.S.C. §119 to Korean Patent Application No. 10-2011-0088094 filed on Aug. 31, 2011. The disclosures of both of the above referenced applications are hereby incorporated herein by reference in their entireties.

BACKGROUND

1. Field

Embodiments of inventive concepts relate to semiconductor packages having supporting plates and a plurality of semiconductor chips, and methods of forming the same.

2. Description of Related Art

Research into various methods of reducing the size of a semiconductor packages and mounting a plurality of semiconductor chips has been underway.

SUMMARY

Embodiments of inventive concepts may provide a semiconductor package capable of shortening a signal transmission path, reducing size, and/or mounting a plurality of semiconductor chips.

Problems to be resolved according to inventive concept may not be limited to the above, and other problems that are not described may be understood by one of ordinary skill in the art based on the following descriptions.

In accordance with some aspects of inventive concepts, a semiconductor package may be provided. The semiconductor package may include a first semiconductor chip mounted on a substrate. At least one supporting plate may be mounted on the substrate and disposed on the same level as the first semiconductor chip. A first conductive connection may be disposed between the first semiconductor chip and the supporting plate, and may be configured to connect the first semiconductor chip to the substrate. A chip stack may be mounted on the supporting plate and the first semiconductor chip. The chip stack may have a plurality of second semiconductor chips, and first and second adhesion layers may be provided. The first adhesion layer may be formed between a lowermost second semiconductor chip of the plurality of second semiconductor chips and the supporting plate and between the lowermost second semiconductor chip and the first semiconductor chip. The second adhesion layer may be formed between the plurality of second semiconductor chips. The first adhesion layer may be thicker than the second adhesion layer. The first conductive connection may penetrate the inside of the first adhesion layer.

In an applied embodiment, the first adhesion layer may have the same width as the lowermost second semiconductor chip.

In another embodiment, the first adhesion layer may be in direct contact with the lowermost second semiconductor chip, the supporting plate, and the first semiconductor chip.

In still another embodiment, the supporting plate may include a first supporting plate, and a second supporting plate separated from the first supporting plate. The first semiconductor chip may be disposed between the first and second supporting plates.

In yet another embodiment, the supporting plate may be a dummy chip having the same vertical thickness as the first semiconductor chip.

In yet another embodiment, top surfaces of the supporting plate and the first semiconductor chip may have substantially the same horizontal level.

In yet another embodiment, a part of the plurality of second semiconductor chips may be sequentially offset-aligned in a first direction and may constitute a first chip stack. Another part of the plurality of second semiconductor chips may be sequentially offset-aligned on the first chip stack in a second direction different from the first direction and may constitute a second chip stack.

In yet another embodiment, the first semiconductor chip may be a logic chip, and the plurality of second semiconductor chips may be memory chips.

In yet another embodiment, a buffer chip may be mounted between the substrate and the chip stack. A second conductive connection may be configured to connect the buffer chip to the substrate. The second conductive connection may penetrate the inside of the first adhesion layer.

In yet another embodiment, a passive device may be mounted on the same level as the supporting plate.

In yet another embodiment, the first conductive connection may include a wire bonding.

In accordance with another aspect of inventive concepts, a semiconductor package may be provided. The semiconductor package may include a first semiconductor chip mounted on a substrate. A first conductive connection may be configured to connect the first semiconductor chip to the substrate. At least one supporting plate may be mounted on the substrate and disposed on the same level as the first semiconductor chip. A chip stack may be mounted on the supporting plate and the first semiconductor chip. The chip stack may have a plurality of second semiconductor chips, a first adhesion layer and a second adhesion layer. A second conductive connection may be configured to sequentially connect the plurality of second semiconductor chips, and to connect a lowermost second semiconductor chip of the plurality of second semiconductor chips to the substrate. A second chip stack may be mounted on the first chip stack. The second chip stack may have a plurality of third semiconductor chips, a third adhesion layer, and a fourth adhesion layer. The first adhesion layer may be formed between the lowermost second semiconductor chip and the supporting plate and between the lowermost second semiconductor chip and the first semiconductor chip. The second adhesion layer may be formed between the plurality of second semiconductor chips. The third adhesion layer may be formed between an uppermost second semiconductor chip of the plurality of second semiconductor chips and a lowermost third semiconductor chip of the plurality of third semiconductor chips. The fourth adhesion layer may be formed between the plurality of third semiconductor chips. The third adhesion layer may be thicker than the second adhesion layer. The second conductive connection may penetrate the inside of the third adhesion layer. A sidewall of an uppermost semiconductor chip of the first chip stack may be vertically aligned with that of a lowermost semiconductor chip of the second chip stack.

In another embodiment, the plurality of second semiconductor chips may be sequentially stacked, and sequentially offset-aligned in a first direction. The plurality of third semiconductor chips may be sequentially stacked, and sequentially offset-aligned in a second direction different from the first direction.

In still another embodiment, the second conductive connection may be separated from the second adhesion layer.

Details of other embodiments of inventive concepts are included in the detailed description and the drawings.

In accordance with still other aspects of inventive concepts, a semiconductor package may include a packaging substrate, a first semiconductor chip on the packaging substrate, and a support plate on the packaging substrate. The support plate may be spaced apart from the first semiconductor chip in a direction parallel with respect to a surface of the packaging substrate. A second semiconductor chip may be provided on the first semiconductor chip and on the support plate so that the first semiconductor chip is between the second semiconductor chip and the packaging substrate and so that the support plate is between the second semiconductor chip and the packaging substrate. An adhesion layer may bond the second semiconductor chip to the first semiconductor chip and may bond the second semiconductor chip to the support plate. In addition, an electrical coupling may be provided between the first semiconductor chip and the packaging substrate, with at least a portion of the electrical coupling being physically located directly between second semiconductor chip and the packaging substrate in a direction perpendicular with respect to the surface of the packaging substrate.

BRIEF DESCRIPTION OF THE DRAWINGS

The foregoing and other features and advantages of inventive concepts will be apparent from the more particular description of embodiments of inventive concepts, as illustrated in the accompanying drawings in which like reference characters refer to the same parts throughout the different views. The drawings are not necessarily to scale, emphasis instead being placed upon illustrating principles of inventive concepts. In the drawings.

DETAILED DESCRIPTION OF THE EMBODIMENTS

Figure 1:
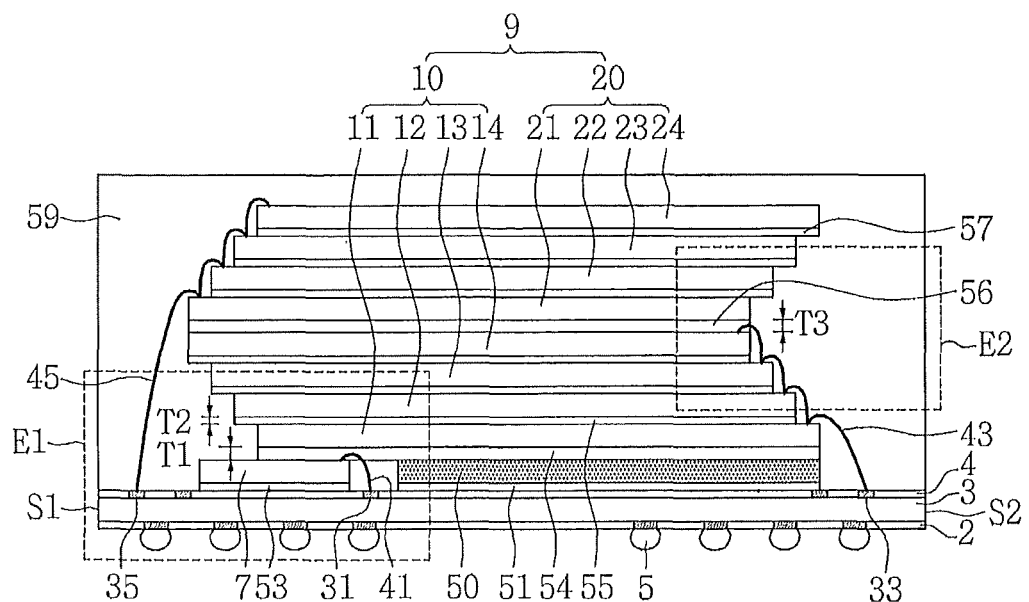
FIG. 1 is a cross-sectional view of a semiconductor package according to first embodiments of inventive concepts.

Various embodiments will now be described more fully with reference to the accompanying drawings in which some embodiments are shown. Inventive concepts may, however, be embodied in different forms and should not be construed as limited to embodiments set forth herein. Rather, these embodiments are provided so that this disclosure is thorough and complete and fully conveys the scope of inventive concepts to one skilled in the art. In the drawings, thicknesses of layers and regions may be exaggerated for clarity. Also, when a layer is referred to as "on" another layer or a substrate, it may be directly formed on another layer or the substrate or a third layer may be interposed therebetween. Like reference numerals designate like elements throughout the specification.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of inventive concepts.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms used herein should be interpreted as having a meaning that is consistent with their meaning in the context of this disclosure and the relevant art and will not be interpreted in an idealized or overly formal sense unless expressly so defined herein.

First Embodiments

Figure 2A:
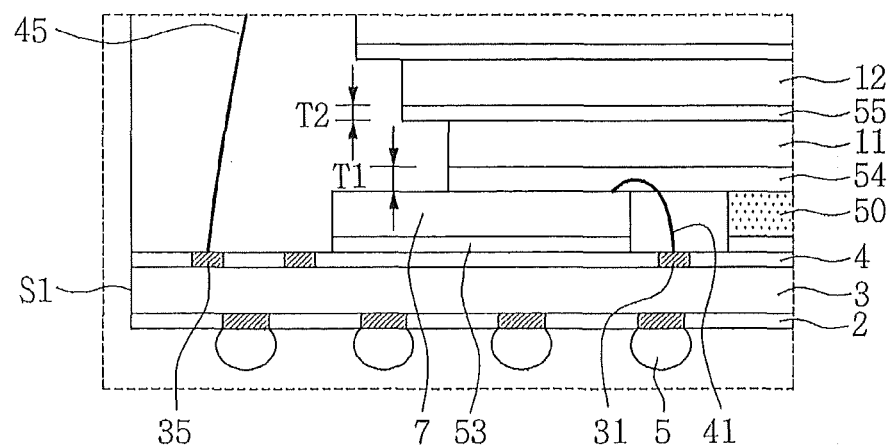
FIG. 2A is a partial enlarged view of portion E1 of FIG. 1.
Figure 2B:
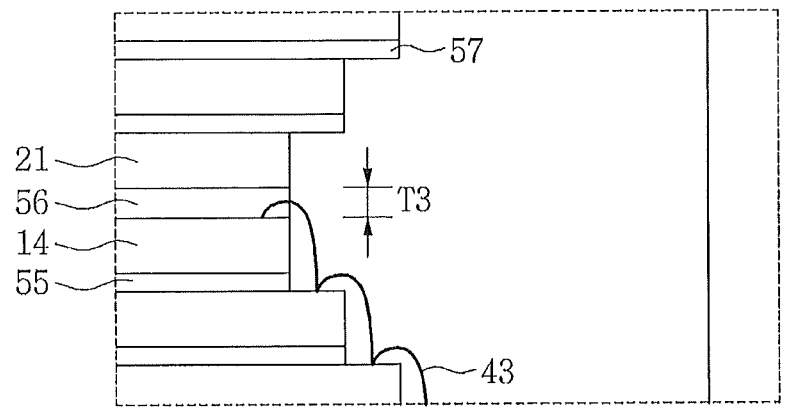
FIG. 2B is a partial enlarged view of portion E2 of FIG. 1.
Figure 2C:
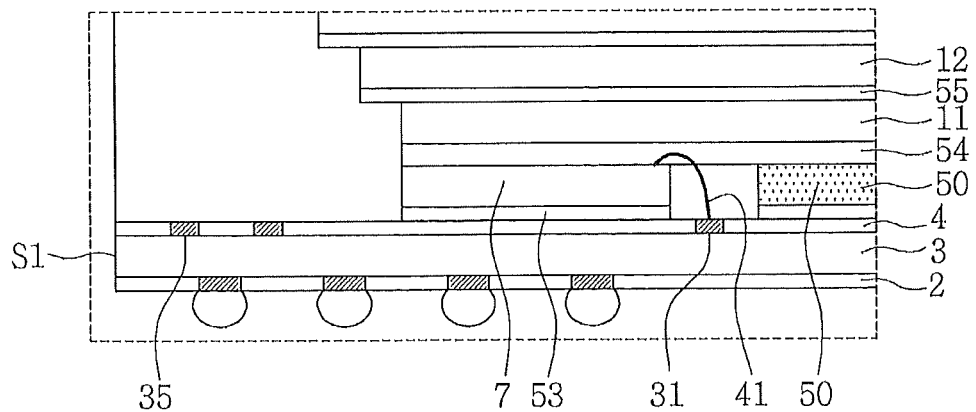
FIG. 2C is a partial enlarged view of a semiconductor package according to an application of first embodiments.

FIG. 1 is a cross-sectional view of a semiconductor package according to first embodiments of inventive concepts, FIG. 2A is a partial enlarged view of portion E1 of FIG. 1, FIG. 2B is a partial enlarged view of portion E2 of FIG. 1, and FIG. 2C is a partial enlarged view of a semiconductor package according to an application of first embodiments.

Referring to FIGS. 1, 2A and 2B, a first semiconductor chip 7 and a supporting plate 50 may be mounted on a substrate 3. A chip stack 9 may be mounted on the first semiconductor chip 7 and the supporting plate 50. An encapsulant 59 may be provided on the substrate 3 covering the first semiconductor chip 7, the supporting plate 50, and the chip stack 9.

A bottom surface of the substrate 3 may be covered with a lower solder resist 2, and a top surface of the substrate 3 may be covered with an upper solder resist 4. A first electrode finger(s) 31, a second electrode finger(s) 33, and a third electrode finger(s) 35 may be formed on the substrate 3 penetrating the upper solder resist 4. A first adhesion layer 51 may be interposed between the substrate 3 and the supporting plate 50. A second adhesion layer 53 may be interposed between the substrate 3 and the first semiconductor chip 7. A first conductive connection(s) 41 may be formed between the first semiconductor chip 7 and the first electrode finger(s) 31. The first conductive connection(s) 41 may include a bonding wire, a beam lead, a conductive tape, a conductive spacer, a through electrode, a solder ball, a solder bump, and/or a combination thereof. The first conductive connection(s) 41 may be a bonding wire.

The first semiconductor chip 7 may be a logic chip such as a controller. The supporting plate 50 may have substantially the same vertical thickness as the first semiconductor chip 7. The supporting plate 50 may be a dummy chip having a constitution similar to that of to the first semiconductor chip 7. The first semiconductor chip 7 and the supporting plate 50 may be mounted on a same level. Top surfaces of the first semiconductor chip 7 and the supporting plate 50 may be disposed on substantially a same horizontal level. Stated in other words, top surfaces of the first semiconductor chip 7 and the supporting plate 50 may be substantially co-planar.

The chip stack 9 may include a first chip stack 10 and a second chip stack 20 on the first chip stack 10. The first chip stack 10 may include second to fifth semiconductor chips 11, 12, 13, and 14, and the second chip stack 20 may include sixth to ninth semiconductor chips 21, 22, 23, and 24. The second to ninth semiconductor chips 11, 12, 13, 14, 21, 22, 23, and 24 may be memory chips. For example, each of the second to ninth semiconductor chips 11, 12, 13, 14, 21, 22, 23, and 24 may include a non-volatile memory device such as a NAND flash memory.

The second to fifth semiconductor chips 11, 12, 13, and 14 may be stacked in a first cascade structure. That is, the second to fifth semiconductor chips 11, 12, 13, and 14 may be sequentially offset-aligned. Each of the second to fifth semiconductor chips 11, 12, 13, and 14 may have a greater width than the first semiconductor chip 7. The semiconductor chip 11 may be bonded onto the supporting plate 50 and the first semiconductor chip 7 using a third adhesion layer 54 of a first thickness T1. A side surface of the second semiconductor chip 11 may be vertically aligned with that of the supporting plate 50. The other side surface of the second semiconductor chip 11 may be aligned on the first semiconductor chip 7. The third to fifth semiconductor chips 12 to 14 may be sequentially stacked on the second semiconductor chip 11 using a fourth adhesion layer(s) 55 of a second thickness T2. In this case, the third to fifth semiconductor chips 12 to 14 may be sequentially offset-aligned in a direction of a first side surface S1 of the substrate 3.

The first thickness T1 of the third adhesion layer 54 may be larger than the second thickness T2 of the fourth adhesion layer(s) 55. The first conductive connection(s) 41 may penetrate the inside of the third adhesion layer 54. For example, when the first conductive connection(s) 41 is a bonding wire, a part of the bonding wire may partially penetrate or pass through the third adhesion layer 54.

When the first conductive connection(s) 41 penetrates or passes through the third adhesion layer 54, an electrical connection may be made even though a top surface of the first semiconductor chip 7 is not exposed. Therefore, the first conductive connection(s) 41 may be formed between the supporting plate 50 and the first semiconductor chip 7. As a result, the horizontal widths of the semiconductor packages according to inventive concepts may be reduced. Specifically, if the first conductive connection(s) 41 does not penetrate or pass through the third adhesion layer 54, the first conductive connection(s) 41 may be formed on the outside of an area occupied by the chip stack 9 and/or outside of the first semiconductor chip 7. However, since the first conductive connection(s) 41 may be capable of penetrating or passing through the third adhesion layer 54, the first conductive connection(s) 41 may be formed between the first semiconductor chip 7 and the supporting plate 50, i.e., within an area occupied by the chip stack 9. Therefore, a horizontal width of an area occupied by the semiconductor package may be reduced by as much as an area occupied by the first conductive connection(s) 41.

The third adhesion layer 54 may have the same width as the second semiconductor chip 11. The third adhesion layer 54 may be aligned with a surface of the second semiconductor chip 11. The third adhesion layer 54 may be in direct contact with the second semiconductor chip 11, the first semiconductor chip 7, and the supporting plate 50.

The third adhesion layer 54 may be referred to as a direct adhesive film (DAF) or a film over wire (FOW). The fourth adhesion layer(s) 55 may be a material layer of the same type as the third adhesion layer 54. In this case, the second thickness T2 of the fourth adhesion layer(s) 55 may be smaller than the first thickness T1 of the third adhesion layer 54. In some embodiments, the fourth adhesion layer(s) 55 may be a different material layer from the third adhesion layer 54.

A second conductive connection(s) 43 may be formed between the first chip stack 10 and the second electrode finger(s) 33. The second semiconductor chip 11 may be connected to the second electrode finger(s) 33 and the second to fifth semiconductor chips 11, 12, 13 and 14 may be connected to each other by the second conductive connection(s) 43. As illustrated in the drawings, the second conductive connection(s) 43 may be sequentially in contact with the second to fifth semiconductor chips 11, 12, 13 and 14, and one end of the second conductive connection(s) 43 may be in contact with the second electrode finger(s) 33. The second conductive connection(s) 43 may be separated from the fourth adhesion layer(s) 55. The second conductive connection(s) 43 may include a bonding wire(s), a beam lead(s), a conductive tape(s), a conductive spacer(s), a through electrode(s), a solder ball(s), a solder bump(s) and/or a combination thereof. Embodiments of FIG. 1 are described on the assumption that the second conductive connection(s) 43 is a bonding wire.

The sixth to ninth semiconductor chips 21, 22, 23 and 24 may be stacked in a second cascade structure. The sixth to ninth semiconductor chips 21, 22, 23 and 24 may be aligned in a different direction from the second to fifth semiconductor chips 11, 12, 13 and 14. That is, the sixth to ninth semiconductor chips 21, 22, 23 and 24 may be sequentially offset-aligned in a different direction from the second to fifth semiconductor chips 11, 12, 13 and 14.

For example, the sixth semiconductor chip 21 may be bonded onto the fifth semiconductor chip 14 using a fifth adhesion layer 56 of a third thickness T3. The third thickness T3 may be larger than the second thickness T2. The third thickness T3 may be substantially the same as the first thickness T1. The sixth semiconductor chip 21 may be vertically aligned on the fifth semiconductor chip 14. Side surfaces of the sixth semiconductor chip 21 and the fifth semiconductor chip 14 may be aligned along the same vertical line(s). The fifth adhesion layer 56 may be the same material layer as the third adhesion layer 54. The second conductive connection(s) 43 may penetrate the inside of the fifth adhesion layer 56. When the second conductive connection(s) 43 is a bonding wire, a part of the bonding wire may partially penetrate or pass through the fifth adhesion layer 56. When the second conductive connection(s) 43 penetrates or passes through the inside of the fifth adhesion layer 56, a horizontal width of the semiconductor package may be reduced. If the third thickness T3 is not sufficient and/or the second conductive connection(s) 43 does not penetrate or pass through the inside of the fifth adhesion layer 54, a semiconductor chip disposed at an uppermost part of the first chip stack 10, (i.e., a part of a top surface of the fifth semiconductor chip 14) may need to be exposed for the purpose of an electrical connection to the second conductive connection(s) 43. Therefore, in embodiments of inventive concepts, a side surfaces of the semiconductor chip 14 disposed at the uppermost part of the first chip stack 10 may be vertically aligned with that of the semiconductor chip 21 disposed at a lowermost part of the second chip stack 20. That is, a horizontal width of the semiconductor package may be reduced by aligning the fifth and sixth semiconductor chips 14 and 21 so that a top surface of the semiconductor chip 14 is not exposed.

The seventh to ninth semiconductor chips 22 to 24 may be sequentially bonded onto the sixth semiconductor chip 21 using sixth adhesion layer(s) 57. The seventh to ninth semiconductor chips 22 to 24 may be sequentially offset-aligned on the sixth semiconductor chip 21 in a direction of a second side surface S2 of the substrate 3 opposite the first side surface S1. The sixth adhesion layer(s) 57 may be formed of the same material layer formed to substantially the same thickness as the fourth adhesion layer(s) 55. The fourth adhesion layer(s) 55 and the sixth adhesion layer(s) 57 may be the same material layer as the third adhesion layer 54.

A third conductive connection(s) 45 may be formed between the second chip stack 20 and the third electrode finger(s) 35. The sixth semiconductor chip 21 may be connected to the third electrode finger(s) 35, and the sixth to ninth semiconductor chips 21 to 24 may be connected to each other by the third conductive connection(s) 45. As illustrated in FIG. 1, the third conductive connection(s) 45 may be sequentially in contact with the sixth to ninth semiconductor chips 21 to 24, and one end of the third conductive connection(s) 45 may be in contact with the third electrode finger(s) 35. The third conductive connection(s) 45 may be separated from the sixth adhesion layer(s) 57.

The third conductive connection(s) 45 may include a bonding wire(s), a beam lead(s), a conductive tape(s), a conductive spacer(s), a through electrode(s), a solder ball(s), a solder bump(s), and/or a combination thereof. Embodiments of FIG. 1 are described on the assumption that the third conductive connection(s) 45 is a bonding wire.

In addition, when the first conductive connection(s) 41 is formed between the supporting plate 50 and the first semiconductor chip 7, the first conductive connection(s) 41 may not electrically or physically influence the third conductive connection(s) 45. Therefore, the third conductive connection(s) 45 may be more electrically and/or physically stable, and may be simplified and may be formed with fewer restrictions.

External terminals 5 penetrating the lower solder register 2 may be formed at a lower part of the substrate 3. The first electrode finger(s) 31, the second electrode finger(s) 33 and the third electrode finger(s) 35 may be electrically connected to respective ones of the external terminals 5 through the substrate 3. The external terminals 5 may include solder balls, solder bumps, pin grid arrays, lead grid arrays, conductive tabs, and/or a combination thereof.

In other embodiments, the substrate 3, the first semiconductor chip 7, the supporting plate 50, the chip stack 9, and the encapsulant 59 may be provided as a card-type package. In this case, the external terminals 5 may be omitted.

In still other embodiments, the second to fifth semiconductor chips 11 to 14 and the sixth to ninth semiconductor chips 21 to 24 may be stacked on the supporting plate 50 and the first semiconductor chip 7 in a cascade, overhang or zigzag form, or in a combination form thereof.

Referring to FIG. 2C, the second semiconductor chip 11 may completely cover the first semiconductor chip 7.

As described above, a semiconductor package according to embodiments of inventive concepts may include a structure in which the second to fifth adhesion layers 11 to 14 and the sixth to ninth semiconductor chips 21 to 24 are stacked on the supporting plate 50 and the first semiconductor chip 7 using the third adhesion layer 54, the fourth adhesion layer(s) 55, the fifth adhesion layer 56 and the sixth adhesion layer(s) 57. A part of the first conductive connection(s) 41 may partially penetrate or pass through the third adhesion layer 54. The first conductive connection(s) 41 may be formed between the supporting plate 50 and the first semiconductor chip 7. In this case, a horizontal width of the semiconductor package may be significantly reduced. Moreover, a part of the second conductive connection(s) 43 may partially penetrate or pass through the fifth adhesion layer 56. The sixth semiconductor chip 21 may be vertically aligned on the fifth semiconductor chip 14. In this case, a horizontal width of the semiconductor package may be reduced. Consequently, the semiconductor package may have an advantageous structure in terms of mounting of a plurality of semiconductor chips and reducing size.

Also, the second to fifth semiconductor chips 11 to 14, and/or the sixth to ninth semiconductor chips 21 to 24 may receive and/or transmit data from and to external devices via the first conductive connection(s) 41, the second conductive connection(s) 43, the third conductive connection(s) 45, the first semiconductor chip 7, and/or the substrate 3. Accordingly, a signal transmission path of the semiconductor package may be significantly reduced compared to related art. Furthermore, a structure of the supporting plate 50, the first semiconductor chip 7, and the third adhesion layer 54 may improve structural stability of the second to ninth semiconductor chips 11, 12, 13, 14, 21, 22, 23 and 24.

Second Embodiments

FIGS. 3 to 8 are layout diagrams of a semiconductor package according to second embodiments of inventive concepts, and FIGS. 9 to 15 are cross-sectional views of a semiconductor package according to second embodiments of inventive concepts.

Figure 3:
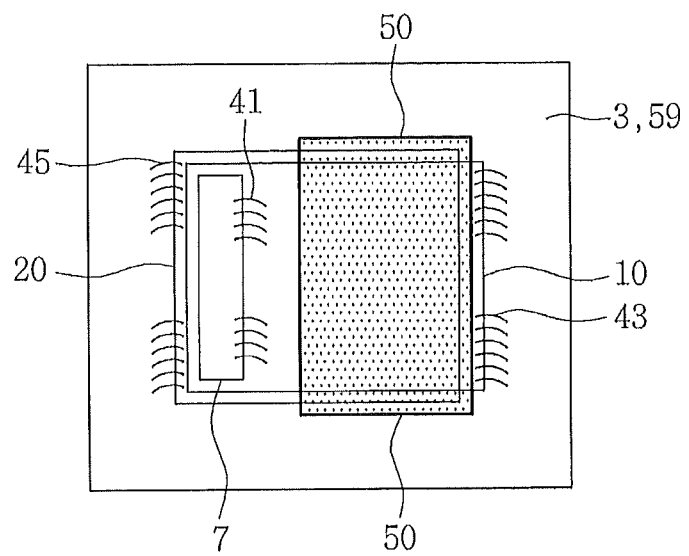
FIGS. 3 to 15 are layout diagrams and cross-sectional views of a semiconductor package according to second embodiments of inventive concepts.

Referring to FIG. 3, a first semiconductor chip 7 may be disposed on substrate 3 to face a supporting plate 50. The supporting plate 50 may be in the shape of a rectangle or bar.

Figure 4:
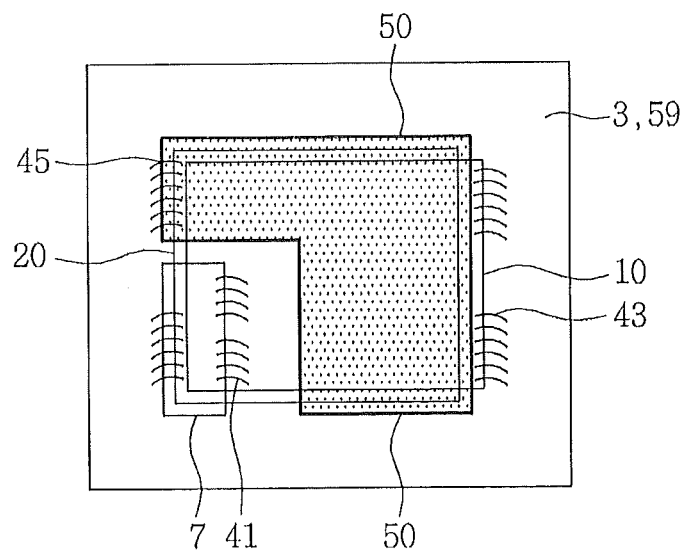
Figure 5:
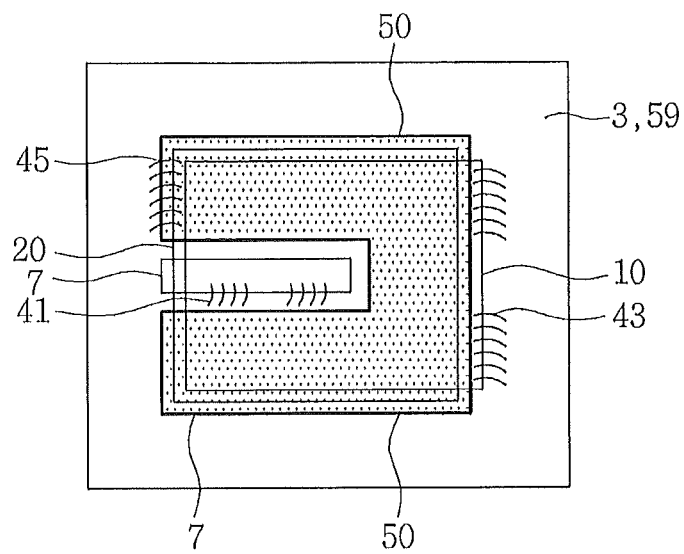
Figure 6:
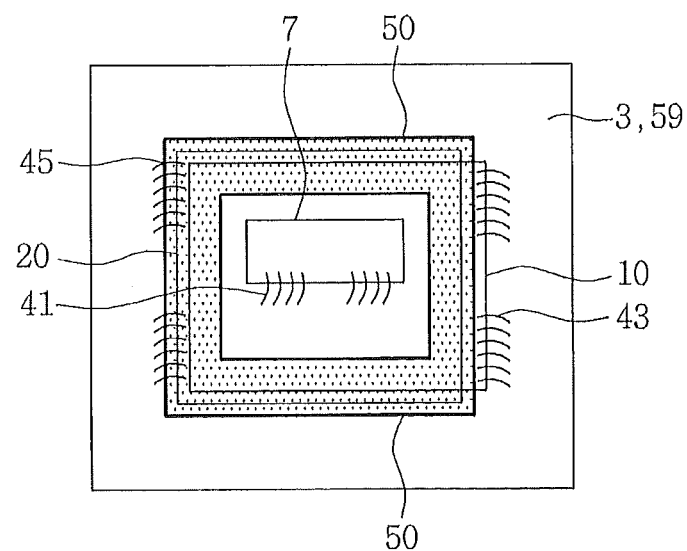

Referring to FIGS. 4 to 6, the supporting plate 50 may be in the shape of an L, a C, or a frame.

Figure 7:
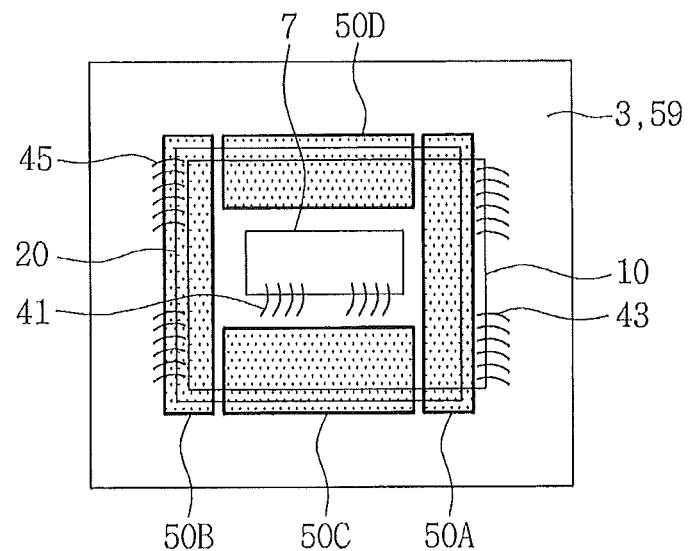

Referring to FIG. 7, a first supporting plate 50A, a second supporting plate 50B, a third supporting plate 50C, and a fourth supporting plate 50D may be bonded onto a substrate 3. The first supporting plate 50A, the second supporting plate 50B, the third supporting plate 50C, and the fourth supporting plate 50D may be aligned to surround the first semiconductor chip 7. The first supporting plate 50A, the second supporting plate 50B, the third supporting plate 50C, and the fourth supporting plate 50D may have various sizes and shapes.

Figure 8:
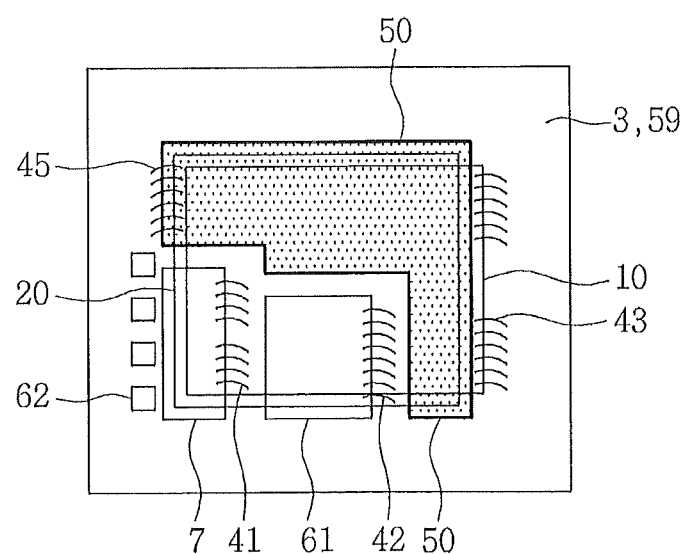

Referring to FIG. 8, a supporting plate 50, a first semiconductor chip 7, a buffer chip 61 and a passive device 62 may be bonded onto a substrate 3. The buffer chip 61 may be electrically connected to the substrate 3 using a fourth conductive connection(s) 42. The supporting plate 50 may be modified into various sizes and shapes in response to disposition(s) of the first semiconductor chip 7, the buffer chip 61, and the passive device 62.

Figure 9:
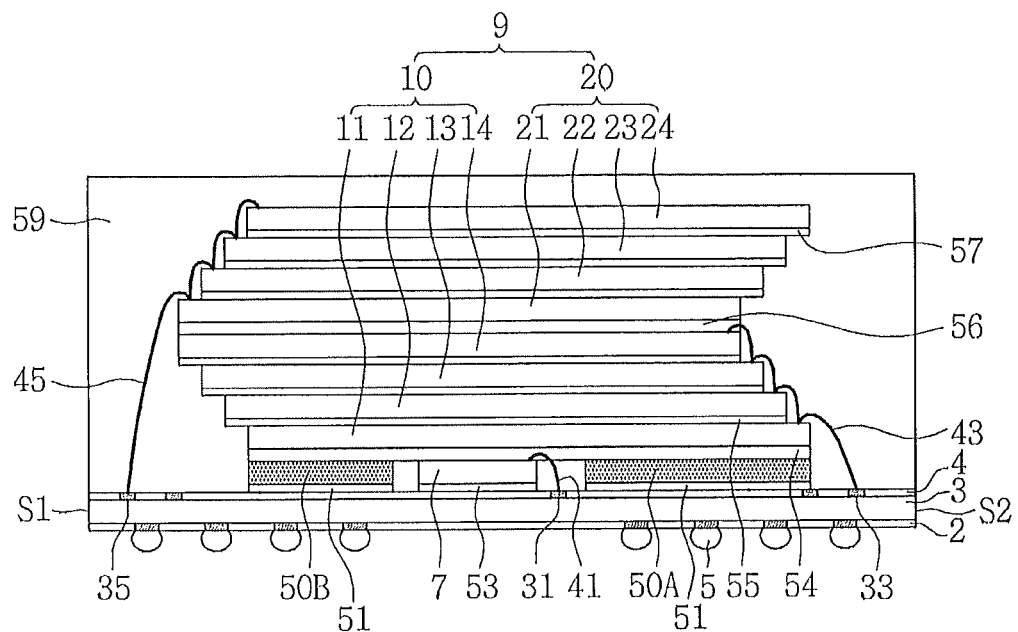

Referring to FIG. 9, a first supporting plate 50A and a second supporting plate 50B may be bonded onto a substrate 3 using a first adhesion layer(s) 51. A first semiconductor chip 7 may be bonded onto the substrate 3 between the first supporting plate 50A and the second supporting plate 50B using a second adhesion layer 53. A second semiconductor chip 11 may be mounted on the first supporting plate 50A, the second supporting plate 50B, and the first semiconductor chip 7 using a third adhesion layer 54. A first conductive connection(s) 41 (penetrating the inside of the third adhesion layer 54) may connect to a first electrode finger(s) 3 of the first semiconductor chip 7.

Figure 10:
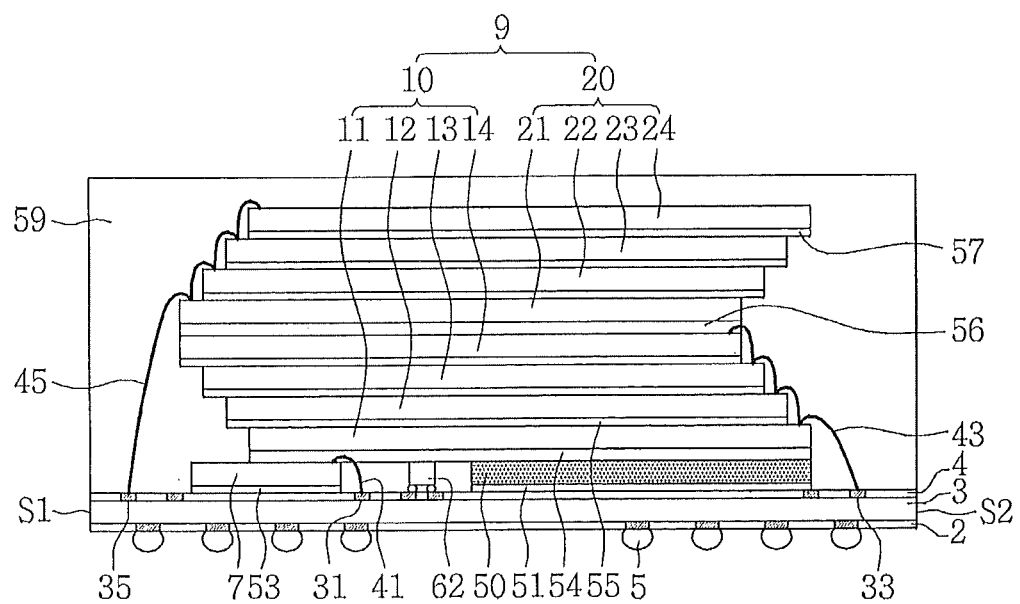

Referring to FIG. 10, a first semiconductor chip 7, a passive device 62, and a supporting plate 50 may be mounted on a substrate 3. The passive device 62 may be disposed between the first semiconductor chip 7 and the supporting plate 50. Top surfaces of the first semiconductor chip 7, the passive device 62, and the supporting plate 50 may have substantially the same horizontal level. Stated in other words, top surfaces of the first semiconductor chip 7, the passive device 62, and the supporting plate 50 may be substantially co-planar. A second semiconductor chip 11 may be mounted on the first semiconductor chip 7, the passive device 62 and the supporting plate 50 using a third adhesion layer 54. The third adhesion layer 54 may be in contact with the second semiconductor chip 11, the first semiconductor chip 7, the passive device 62, and the supporting plate 50. The passive device 62 may include a chip capacitor, a chip resistor, and/or an inductor. As a chip capacitor, the passive device 62 may function as a decoupling capacitor.

Figure 11:
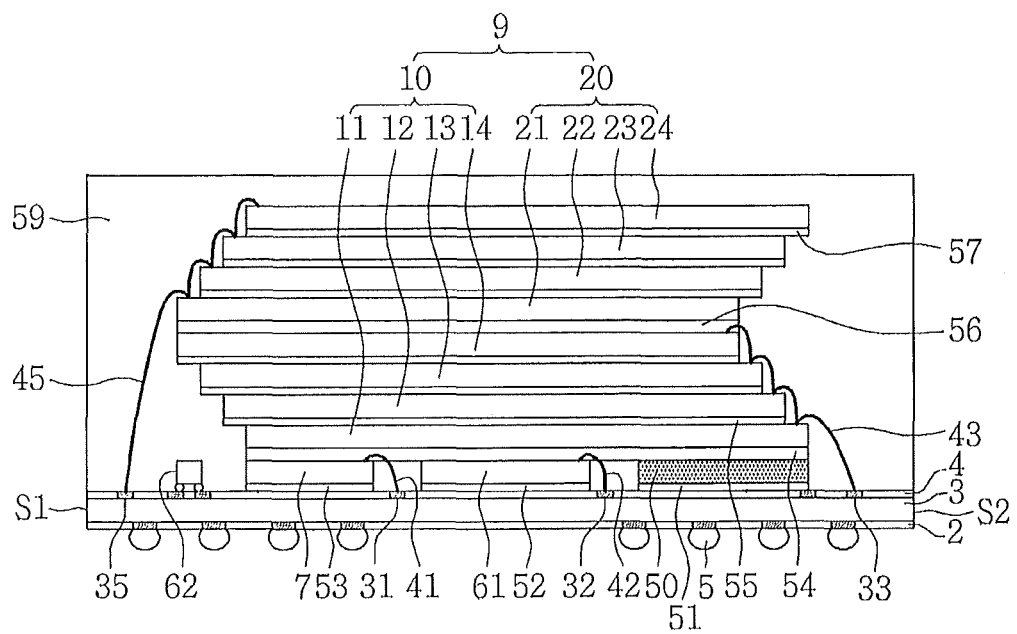

Referring to FIG. 11, a buffer chip 61 may be mounted between a substrate 3 and a chip stack 9. For example, a first semiconductor chip 7, the buffer chip 61, and a supporting plate 50 may be mounted on the substrate 3. The buffer chip 61 may be disposed between the first semiconductor chip 7, and the supporting plate 50. Top surfaces of the first semiconductor chip 7, the buffer chip 61, and the supporting plate 50 may have substantially the same horizontal level. Stated in other words, top surfaces of the first semiconductor chip 7, the buffer chip 61, and the supporting plate 50 may be substantially co-planar. The buffer chip 61 may be electrically connected to a fourth electrode finger(s) 32 formed on the substrate 3 by a fourth conductive connection(s) 42. A second semiconductor chip 11 may be mounted on the first semiconductor chip 7, the buffer chip 61, and the supporting plate 50 using a third adhesion layer 54. The third adhesion layer 54 may be in direct contact with the second semiconductor chip 11, the first semiconductor chip 7, the buffer chip 61, and the supporting plate 50.

The fourth conductive connection(s) 42 may include a bonding wire(s), a beam lead(s), a conductive tape(s), a conductive spacer(s), a through electrode(s), a solder ball(s), a solder bump(s), and/or a combination thereof. In embodiments of FIG. 12, the fourth conductive connection(s) 42 may be a bonding wire(s). The fourth conductive connection(s) 42 may penetrate the inside of the third adhesion layer 54. The buffer chip 61 may include a volatile memory device such as a DRAM or SRAM.

A passive device 62 may be mounted on the substrate 3 adjacent to the first semiconductor chip 7. The passive device 62 may be disposed between the first semiconductor chip 7 and a third electrode finger(s) 35.

In yet other embodiments, relative locations of the first semiconductor chip 7 and the buffer chip 61 may be changed.

Figure 12:
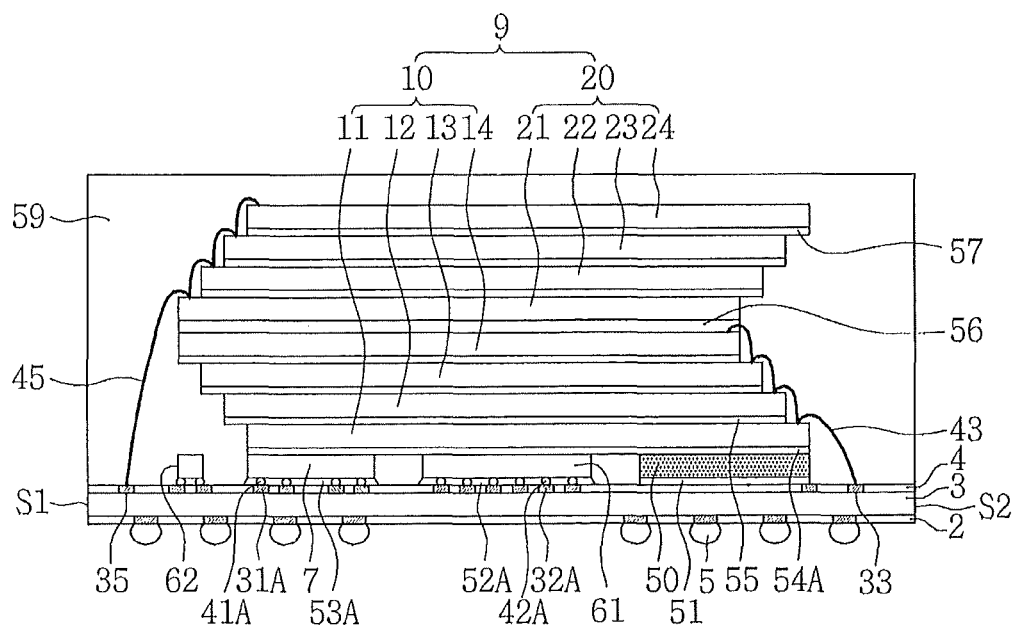

Referring to FIG. 12, a first semiconductor chip 7, a buffer chip 61, and a supporting plate 50 may be mounted on a substrate 3. The first semiconductor chip 7 and the buffer chip 61 may be bonded onto the substrate 3 using a flip chip technique. For example, the first semiconductor chip 7 may be connected to a first electrode finger(s) 31A formed on the substrate 3 using a first conductive connection(s) 41A. A second adhesion layer 53A may be formed between the first semiconductor chip 7 and the substrate 3. The buffer chip 61 may be connected to a fourth electrode finger(s) 32A formed on the substrate 3 using a fourth conductive connection 42A. A seventh adhesion layer 52A may be formed between the buffer chip 61 and the substrate 3.

The first conductive connection(s) 41A and the fourth conductive connection(s) 42A may be a solder ball(s) and/or a solder bump(s). The second adhesion layer 53A and the seventh adhesion layer 52A may include an under fill layer.

A second semiconductor chip 11 may be mounted on the first semiconductor chip 7, the buffer chip 61, and the supporting plate 50 using a third adhesion layer 54A. In this case, the third adhesion layer 54A may be a material layer having substantially the same thickness as a fourth adhesion layer(s) 55.

A passive device 62 may be mounted on the substrate 3 between the first semiconductor chip 7 and a third electrode finger(s) 35.

Figure 13:
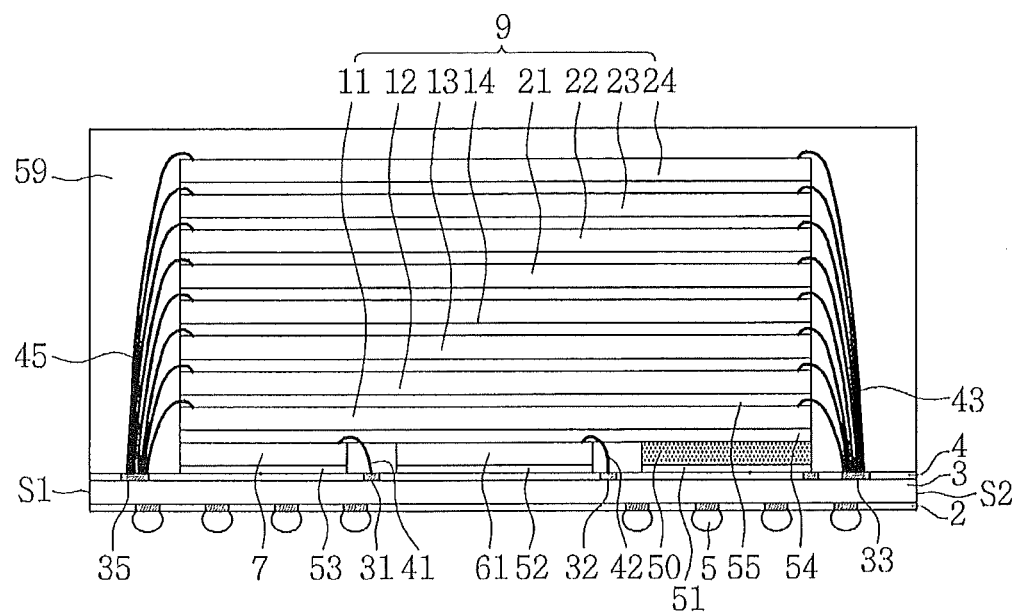

Referring to FIG. 13, second to ninth semiconductor chips 11, 12, 13, 14, 21, 22, 23 and 24 may be mounted on the first semiconductor chip 7, the buffer chip 61, and the supporting plate 50 in an overhang structure. Stated in other words, the second to ninth semiconductor chips 11, 12, 13, 14, 21, 22, 23 and 24 may be sequentially and vertically stacked. The second semiconductor chip 11 may be bonded onto the first semiconductor chip 7, the buffer chip 61, and the supporting plate 50 using a third adhesion layer 54. A fourth adhesion layer(s) 55 may be interposed between the second to ninth semiconductor chips 11, 12, 13, 14, 21, 22, 23 and 24. The fourth adhesion layer(s) 55 may include the same material layer having substantially the same thickness as the third adhesion layer 54.

Each of the second to ninth semiconductor chips 11, 12, 13, 14, 21, 22, 23 and 24 may be connected to a second electrode finger(s) 33 and a third electrode finger(s) 35 using a second conductive connection(s) 43 and a third conductive connection(s) 45. The second conductive connection(s) 43 and the third conductive connection(s) 45 may penetrate inside of the fourth adhesion layer(s) 55. The second conductive connection(s) 43 may include a plurality of bonding wires, and the third conductive connection(s) 45 may include a plurality of bonding wires as well. In this case, each of the plurality of bonding wires may be in contact with the corresponding one of the second to ninth semiconductor chips 11, 12, 13, 14, 21, 22, 23 and 24, and the second electrode finger(s) 33 or the third electrode finger(s) 35.

Figure 14:
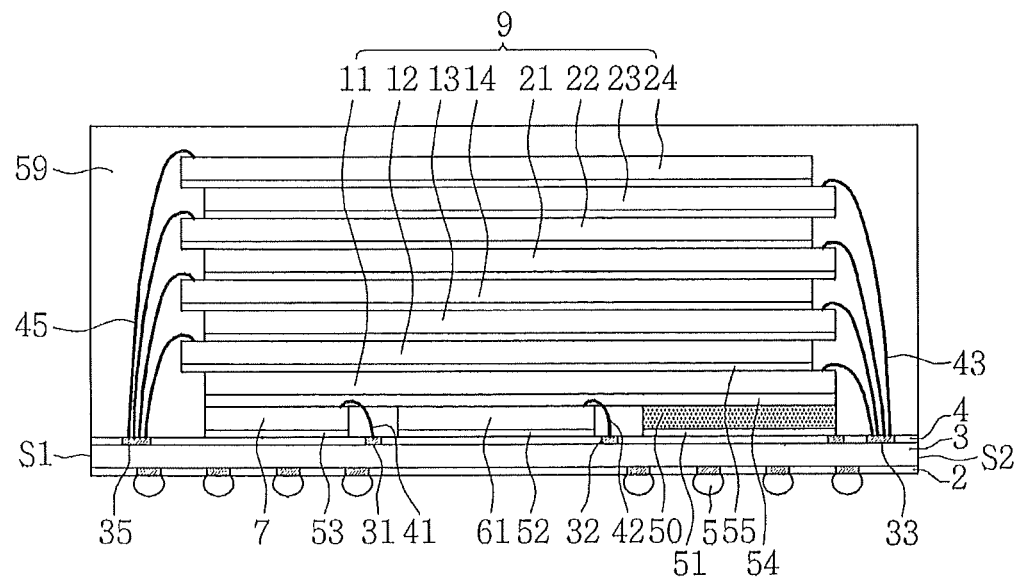

Referring to FIG. 14, the second to ninth semiconductor chips 11, 12, 13, 14, 21, 22, 23 and 24 may be mounted on the first semiconductor chip 7, the buffer chip 61 and the supporting plate 50 in a zigzag structure. Each of the second to ninth semiconductor chips 11, 12, 13, 14, 21, 22, 23 and 24 may be connected to a second electrode finger(s) 33 or a third electrode finger(s) 35 using a second conductive connection(s) 43 or a third conductive connection(s) 45. The second conductive connection(s) 43 and the third conductive connection(s) 45 may be separated from a fourth adhesion layer(s) 55. The fourth adhesion layer(s) 55 may be thinner than the third adhesion layer 54.

Figure 15:
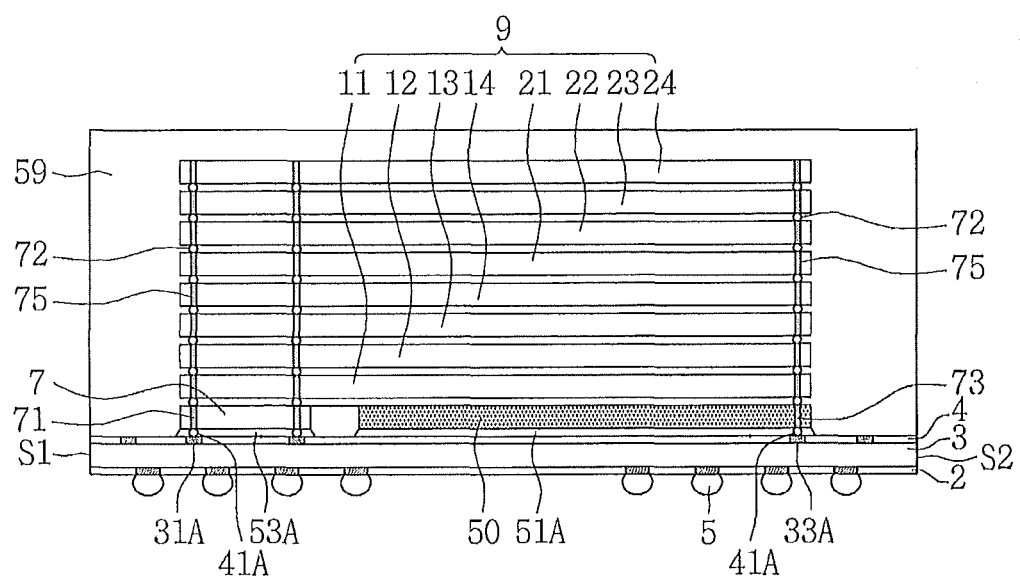

Referring to FIG. 15, a first semiconductor chip 7 and a supporting plate 50 may be mounted on a substrate 3. The first semiconductor chip 7 may include a first through electrode(s) 71, and the supporting plate 50 may include a second through electrode(s) 73. First solder balls 41A may be formed between the first through electrode(s) 71 and first electrode finger(s) 31A and between the second through electrode(s) 73 and a second electrode finger(s) 33A. A first adhesion layer 51A may be formed between the supporting plate 50 and the substrate 3, and a second adhesion layer 53A may be formed between the first semiconductor chip 7 and the substrate 3. The first adhesion layer 51A and the second adhesion layer 53A may include an under fill layer.

The second to ninth semiconductor chips 11, 12, 13, 14, 21, 22, 23 and 24 may be vertically stacked on the supporting plate 50 and the first semiconductor chip 7. Each of the second to ninth semiconductor chips 11, 12, 13, 14, 21, 22, 23 and 24 may include third through electrodes 75. Solder balls 72 may be formed on the third through electrodes 75. The second to ninth semiconductor chips 11, 12, 13, 14, 21, 22, 23 and 24 may be in electrical contact with the first electrode finger(s) 31A and the second electrode finger(s) 33A via the third through electrodes 75, the second solder balls 72, the second through electrode(s) 73, the first through electrode(s) 71, and the first solder balls 41A.

Third Embodiments

FIGS. 16 to 19 are cross-sectional views illustrating methods of forming a semiconductor package according to third embodiments.

Figure 16:
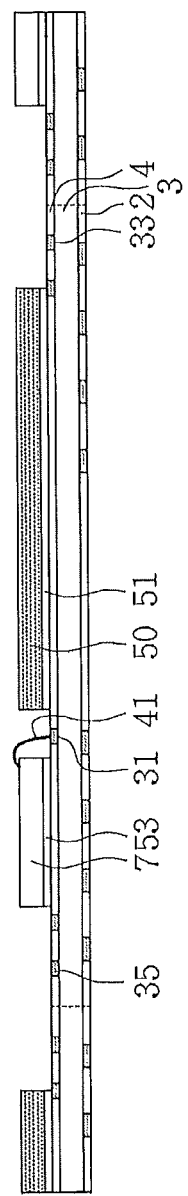
FIGS. 16 to 19 are cross-sectional views illustrating methods of forming a semiconductor package according to third embodiments of inventive concepts.

Referring to FIG. 16, a first semiconductor chip 7 and a supporting plate 50 may be mounted on a substrate 3. The first semiconductor chip 7 and the supporting plate 50 may be mounted on a same level. Top surfaces of the first semiconductor chip 7 and the supporting plate 50 may be exposed on substantially a same planar surface. Stated in other words, top surfaces of the first semiconductor chip 7 and the supporting plate 50 may be substantially co-planar. The supporting plate 50 may be bonded onto the substrate 3 using a first adhesion layer 51. The first semiconductor chip 7 may be bonded onto the substrate 3 using a second adhesion layer 53.

The substrate 3 may be a rigid printed circuit board, a flexible printed circuit board or a rigid-flexible printed circuit board. A first electrode finger(s) 31, a second electrode finger(s) 33 and a third electrode finger(s) 35 may be formed on a surface of the substrate 3. A lower solder resist 2 covering a bottom surface of the substrate 3 may be formed, and an upper solder resist 4 covering a top surface of the substrate 3 and exposing the first electrode finger(s) 31, the second electrode finger(s) 33, and the third electrode finger(s) 35 may be formed.

A first conductive connection(s) 41 may be formed between the first electrode finger(s) 31 and the first semiconductor chip(s) 7. The first conductive connection(s) 41 may include a bonding wire(s), a beam lead(s), a conductive tape(s), a conductive spacer(s), a through electrode(s), a solder ball(s), a solder bump(s), and/or a combination thereof. In embodiments of FIG. 16, the first conductive connection(s) 41 may be a bonding wire(s). The bonding wire(s) may be a gold (Au) wire(s) or an aluminum (Al) wire(s).

The supporting plate 50 may be a dummy chip having the same vertical thickness as the first semiconductor chip 7. In other embodiments, the supporting plate 50 may include a printed circuit board, a metal plate, a plastic plate, and/or a semiconductor substrate.

Figure 17:
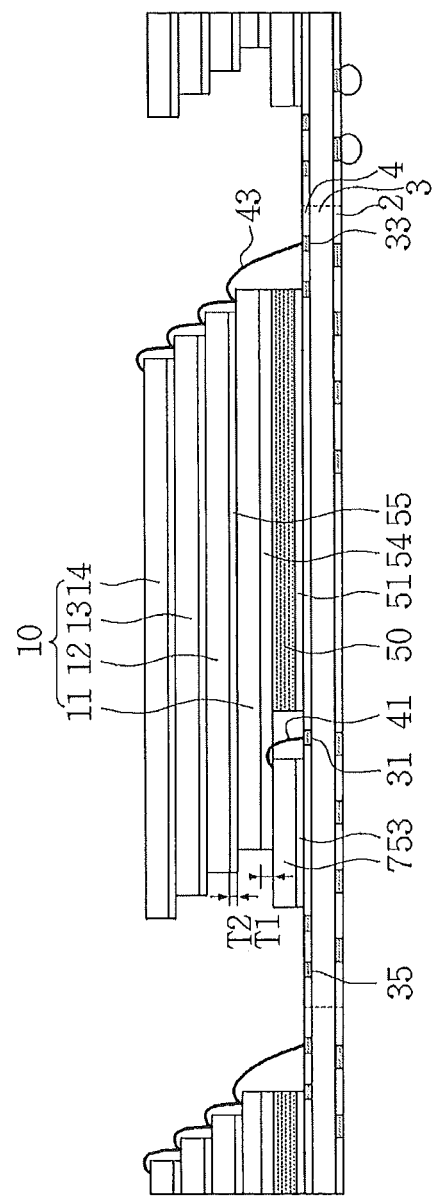

Referring to FIG. 17, a first chip stack 10 may be mounted on the supporting plate 50 and the first semiconductor chip 7. The first chip stack 10 may include second to fifth semiconductor chips 11, 12, 13 and 14. The second to fifth semiconductor chips 11 to 14 may be stacked in a first cascade structure.

The second semiconductor chip 11 may be bonded onto the supporting plate 50 and the first semiconductor chip 7 using a third adhesion layer 54 of a first thickness T1. One side surface of the second semiconductor chip 11 may be vertically aligned with one side surface of the supporting plate 50. The other side surface of the second semiconductor chip 11 may be aligned on the first semiconductor chip 7. The third to fifth semiconductor chips 12 to 14 may be sequentially stacked on the second semiconductor chip 11 using a fourth adhesion layer(s) 55 of a second thickness T2. In this case, the third to fifth semiconductor chips 12 to 14 may be sequentially offset-aligned in the direction of the third electrode finger(s) 35.

The first thickness T1 may be larger than the second thickness T2. The first conductive connection(s) 41 may penetrate the inside of the third adhesion layer 54. For example, when the first conductive connection(s) 41 is a bonding wire(s), a part of the bonding wire(s) may partially penetrate or pass through the third adhesion layer 54. The third adhesion layer 54 may be referred to as a direct adhesive film (DAF) or a film over wire (FOW).

A second conductive connection(s) 43 may be formed between the first chip stack 10 and the second electrode finger(s) 33. The second semiconductor chip 11 may be electrically connected to the second electrode finger(s) 33, and the second to fifth semiconductor chips 11 to 14 may be connected to each other by the second conductive connection(s) 43. As illustrated in FIG. 17, the second conductive connection(s) 43 may be sequentially connected to the second to fifth semiconductor chips 11 to 14, and one end of the second conductive connection(s) 43 may be in contact with the second electrode finger(s) 33. The second conductive connection(s) 43 may be a bonding wire(s).

Figure 18:
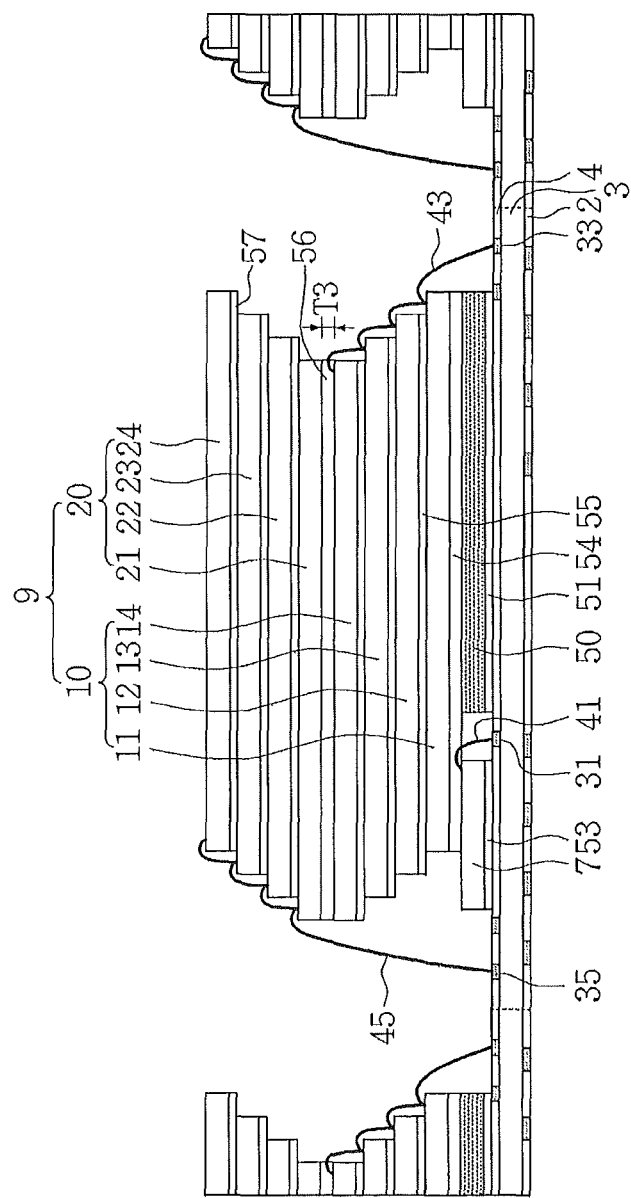

Referring to FIG. 18, a second chip stack 20 may be mounted on the first chip stack 10. The first chip stack 10 and the second chip stack 20 may provide a chip stack 9. The second chip stack 20 may include sixth to ninth semiconductor chips 21, 22, 23 and 24. The sixth to ninth semiconductor chips 21 to 24 may be stacked in a second cascade structure. The sixth to ninth semiconductor chips 21 to 24 may be aligned in a direction that is different than a direction of alignment of the second to fifth semiconductor chips 11 to 14. That is, the sixth to ninth semiconductor chips 21 to 24 may be sequentially offset-aligned in an opposite direction relative to an offset-alignment direction of the second to fifth semiconductor chips 11 to 14.

For example, the sixth semiconductor chip 21 may be bonded onto the fifth semiconductor chip 14 using a fifth adhesion layer 56 of a third thickness T3. The third thickness T3 may be larger than the second thickness T2. The third thickness T3 may be substantially the same as the first thickness T1. The sixth semiconductor chip 21 may be vertically aligned on the fifth semiconductor chip 14. Respective side surfaces of the sixth semiconductor chip 21 and the fifth semiconductor chip 14 may be aligned on the same vertical line(s). The fifth adhesion layer 56 may be the same material layer as the third adhesion layer 54. The second conductive connection(s) 43 may penetrate the inside of the fifth adhesion layer 56. When the second conductive connection(s) 43 is a bonding wire(s), a part of the bonding wire(s) may partially penetrate or pass through the fifth adhesion layer 56.

The seventh to ninth semiconductor chips 22 to 24 may be bonded onto the sixth semiconductor chip 21 using a sixth adhesion layer(s) 57. The seventh to ninth semiconductor chips 22 to 24 may be sequentially offset-aligned on the sixth semiconductor chip 21 in the direction of the second electrode finger(s) 33. The sixth adhesion layer(s) 57 may be the same material layer having substantially the same thickness as the fourth adhesion layer(s) 55. The fifth adhesion layer 56 and the sixth adhesion layer(s) 57 may be the same material layer as the third adhesion layer 54.

A third conductive connection(s) 45 may be formed between the second chip stack 20 and the third electrode finger(s) 35. The sixth semiconductor chip 21 may be connected to the third electrode finger(s) 35, and the sixth to ninth semiconductor chips 21 to 24 may be connected to each other by the third conductive connection(s) 45. As illustrated in the drawing, the third conductive connection(s) 45 may be sequentially in contact with the sixth to ninth semiconductor chips 21 to 24, and one end of the third conductive connection(s) 45 may be in contact with the third electrode finger(s) 35.

Figure 19:
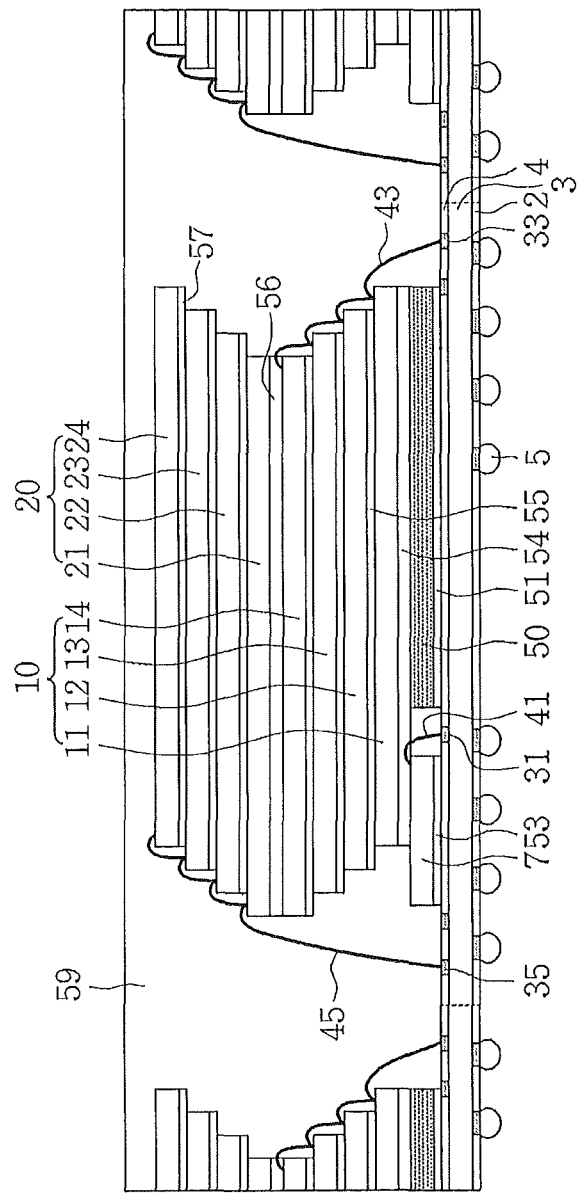

Referring to FIG. 19, an encapsulant 59 covering the entire surface of the substrate 3 may be formed. External terminals 5 may be formed on a back side surface of the substrate 3. The encapsulant 59 may include a molding compound. The external terminals 5 may include solder balls, solder bumps, pin grid arrays, lead grid arrays, conductive tabs, and/or a combination thereof. In other embodiments, the external terminals 5 may be omitted.

Then, the encapsulant 59 and the substrate 3 may be cut using a sawing process. As a result, a semiconductor package similar to that described with reference to FIG. 1 may be formed.

Fourth Embodiments

Figure 20:
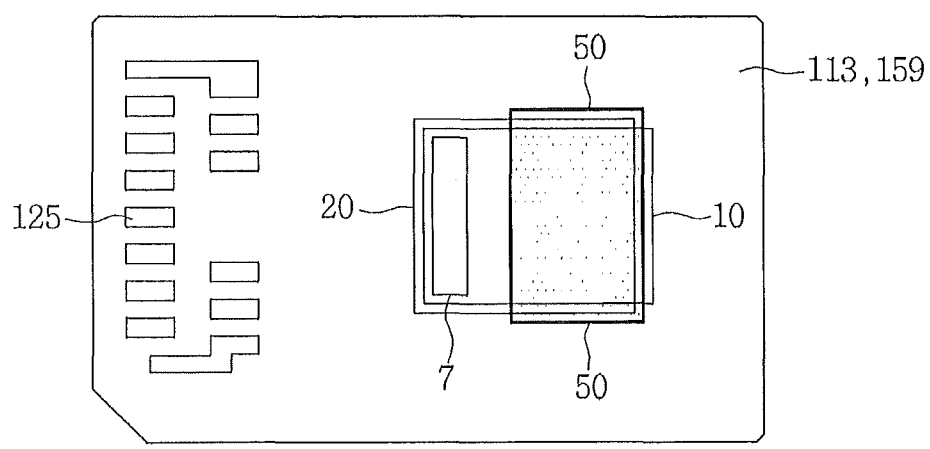
FIGS. 20 and 21 are a layout diagram and a cross-sectional view of a card package according to fourth embodiments of inventive concepts.
Figure 21:
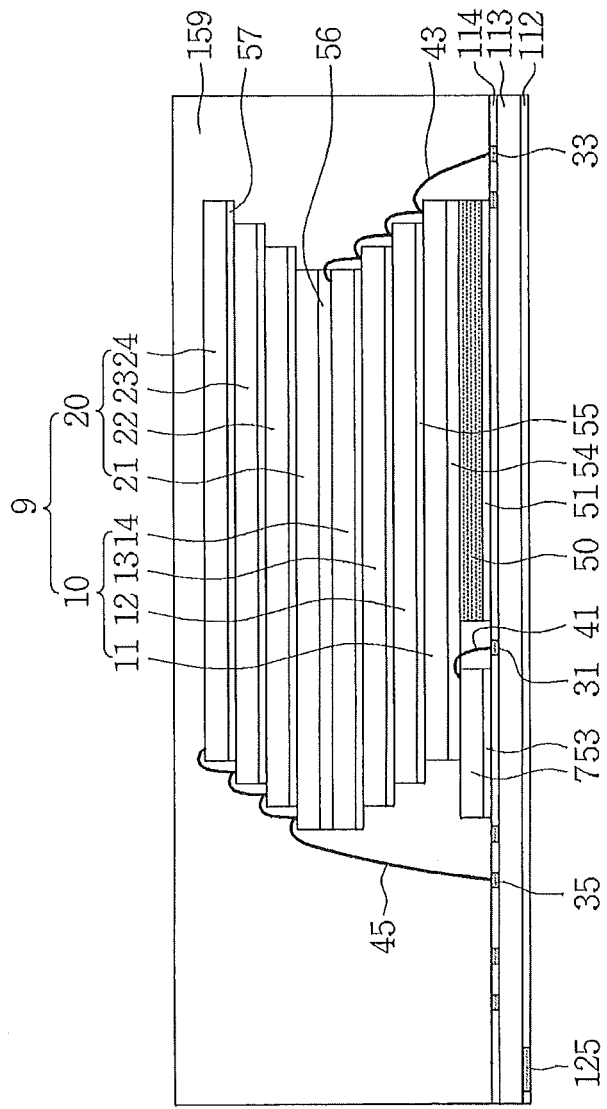

FIG. 20 is a layout diagram of a card package according to fourth embodiments of inventive concepts, and FIG. 21 is a cross-sectional view of a card package according to the fourth embodiments of inventive concepts.

Referring to FIGS. 20 and 21, a first semiconductor chip 7 and a supporting plate 50 may be mounted on a card substrate 113. The first semiconductor chip 7 and the supporting plate 50 may be mounted on a same level. A chip stack 9 may be mounted on the first semiconductor chip 7 and the supporting plate 50. An encapsulant 159 may be provided on the card substrate 113 covering the first semiconductor chip 7, the supporting plate 50 and the chip stack 9.

The card substrate 113 may be covered with a lower solder resist 112 and an upper solder resist 114. A first electrode finger(s) 31, a second electrode finger(s) 33, and a third electrode finger(s) 35 may be formed on the card substrate 113. A first adhesion layer 51 may be interposed between the card substrate 113 and the supporting plate 50. A second adhesion layer 53 may be interposed between the card substrate 113 and the first semiconductor chip 7. A first conductive connection(s) 41 may be formed between the first semiconductor chip 7 and the first electrode finger(s) 31.

The chip stack 9 may include a first chip stack 10 and a second chip stack 20 on the first chip stack 10. The first chip stack 10 may include second to fifth semiconductor chips 11, 12, 13, and 14, and the second chip stack 20 may include sixth to ninth semiconductor chips 21, 22, 23, and 24. The second semiconductor chip 11 may be bonded onto the supporting plate 50 and the first semiconductor chip 7 using a third adhesion layer 54. The third to fifth semiconductor chips 12 to 14 may be sequentially stacked on the second semiconductor chip 11 using a fourth adhesion layer(s) 55. The third adhesion layer 54 may be thicker than the fourth adhesion layer(s) 55. The first conductive connection(s) 41 may penetrate or pass through the third adhesion layer 54. The third adhesion layer 54 may be in contact with the second semiconductor chip 11, the first semiconductor chip 7 and the supporting plate 50.

A second conductive connection(s) 43 may be formed between the first chip stack 10 and the second electrode finger(s) 33. The second conductive connection(s) 43 may be separated from the fourth adhesion layer(s) 55. The sixth semiconductor chip 21 may be bonded onto the fifth semiconductor chip 14 using a fifth adhesion layer 56. The sixth semiconductor chip 21 may be vertically aligned with the fifth semiconductor chip 14. The second conductive connection(s) 43 may penetrate or pass through the fifth adhesion layer 56. The seventh to ninth semiconductor chips 22 to 24 may be bonded onto the sixth semiconductor chip 21 using a sixth adhesion layer(s) 57. A third conductive connection(s) 45 may be formed between the second chip stack 20 and the third electrode finger(s) 35.

External terminals 125 may be formed on one side of the card substrate 113. The first electrode finger(s) 31, the second electrode finger(s) 33, and the third electrode finger(s) 35 may be electrically connected to the external terminals 125. Each of the external terminals 125 may include a conductive tab.

As previously described, the structure of the supporting plate 50, the first semiconductor chip 7 and third adhesion layer 54 may significantly improve the structural stability of the second to ninth semiconductor chips 11, 12, 13, 14, 21, 22, 23 and 24 relative to the related art. Accordingly, the card package of FIGS. 20 and 21 may reduce a signal transmission path with a plurality of semiconductor chips mounted thereon. Moreover, the chip package of FIGS. 20 and 21 may be relatively light, thin, short and compact.

Furthermore, semiconductor packages described with reference to FIGS. 1 to 19 and the methods of forming the same may be variously applied to a card package and methods of forming the same.

Fifth Embodiments

Figure 22:
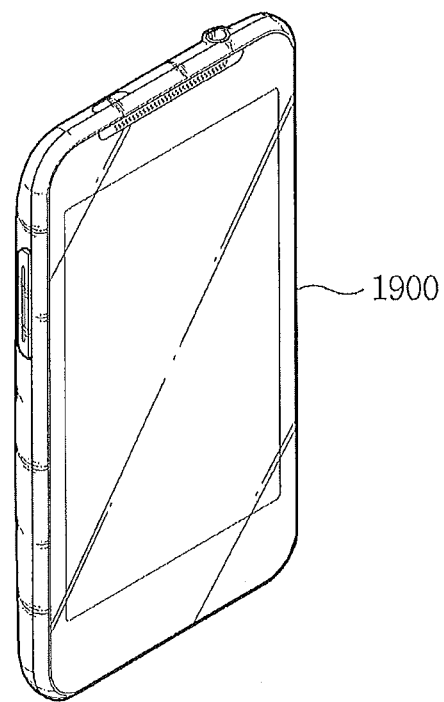
FIGS. 22 and 23 are a perspective view and a system block diagram of an electronic device according to fifth embodiments of inventive concepts.
Figure 23:
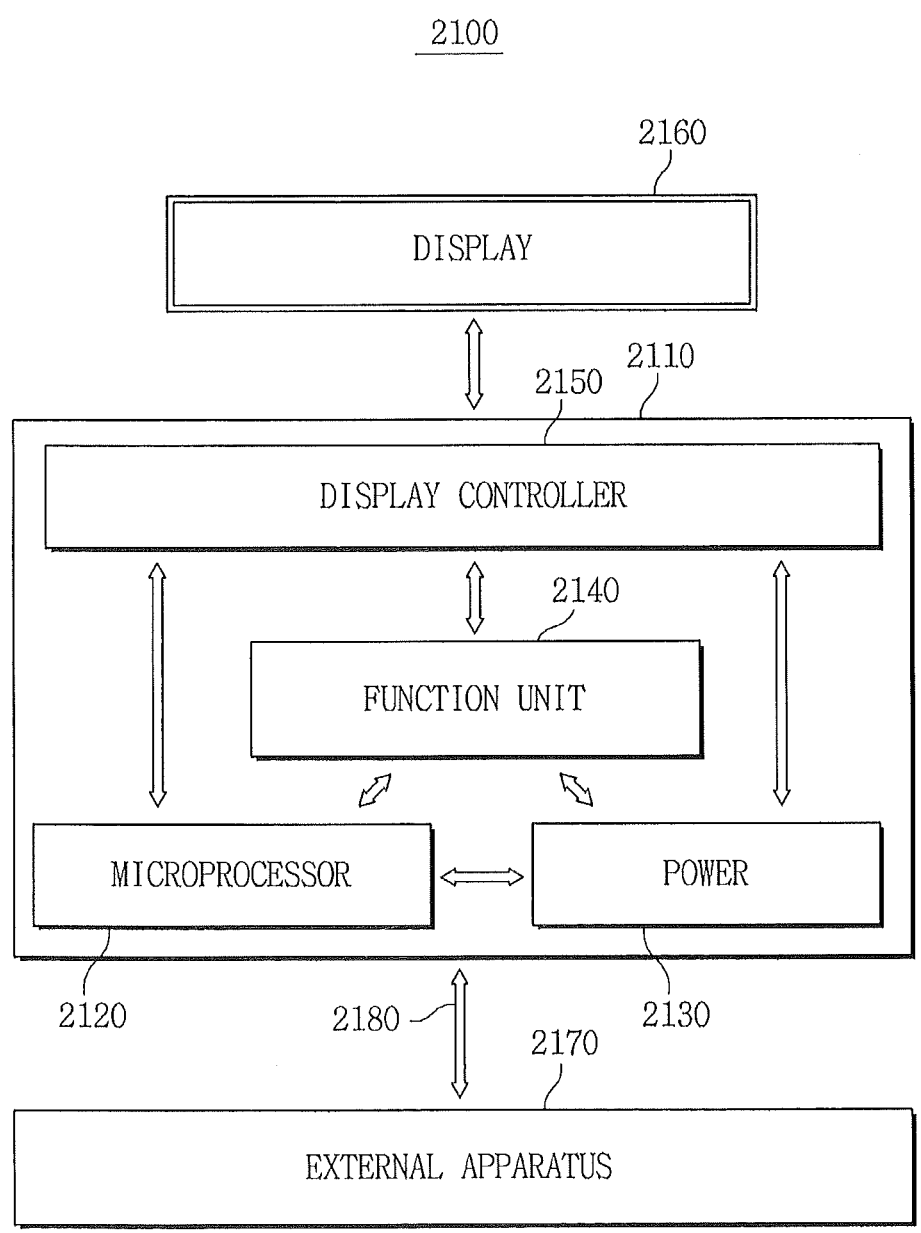

FIGS. 22 and 23 are respectively a perspective view and a system block diagram of an electronic device according to fifth embodiments of inventive concepts.

Referring to FIG. 22, the semiconductor package and the method of forming the same described with reference to FIGS. 1 to 21 may be usefully applied to electronic systems such as a cellular phone 1900, a netbook, a notebook, and/or a tablet PC. For example, a semiconductor package similar to that described with reference to FIGS. 1 to 21 may be mounted on a main board in the cellular phone 1900. Further, a semiconductor package similar to that described with reference to FIGS. 1 to 21 may be provided as a memory expansion device such as an external memory card and combined with the cellular phone 1900.

Referring to FIG. 23, a semiconductor package similar to that described with reference to FIGS. 1 to 21 may be applied to an electronic system 2100. The electronic system 2100 may include a body 2110, a microprocessor unit 2120, a power unit 2130, a function unit 2140, and a display controller unit 2150. The body 2110 may be a mother board formed of a printed circuit board (PCB). The microprocessor unit 2120, the power unit 2130, the function unit 2140, and the display controller unit 2150 may be mounted on the body 2110. A display unit 2160 may be disposed in or on the body 2110. For example, the display unit 2160 may be disposed on the surface of the body 2110 to display an image processed by the display controller unit 2150.

The power unit 2130 may be supplied with a predetermined voltage from an external and/or internal battery (not shown), and the power unit 2130 may divide the received voltage into a required voltage level to supply the divided voltage to the microprocessor unit 2120, the function unit 2140, the display controller unit 2150, etc. The microprocessor unit 2120 may receive a voltage from the power unit 2130 and may control the function unit 2140 and the display unit 2160. The function unit 2140 may perform various functions of the electronic system 2100.

For example, when the electronic system 2100 is a cellular phone, the function unit 2140 may include components capable of performing cellular phone functions (including outputting an image to the display unit 2160, outputting voice to a speaker, etc.), by dialing or communication with an external apparatus 2170. When a camera is mounted, the system may function as a camera image processor.

In an applied example embodiment, when the electronic system 2100 is connected to a memory card to provide capacity expansion, the function unit 2140 may be a memory card controller. The function unit 2140 may transmit or receive a signal to or from the external apparatus 2170 via a wired or wireless communication unit 2180. When the electronic system 2100 uses a universal serial bus (USB) to provide function expansion, the function unit 2140 may function as an interface controller. Moreover, the function unit 2140 may include a mass storage device.

A semiconductor package similar to that described with reference to FIGS. 1 to 21 may be applied to the function unit 2140. For example, the function unit 2140 may include the substrate 3, the external terminals 5, the supporting plate 50, the chip stack 9, and the third adhesion layer 54. The external terminals 5 may be connected to the body 2110. In this case, the electronic system 2100 may exhibit characteristics of being relatively light, thin, short and compact in spite of a plurality of semiconductor chips mounted therein, and a reduced signal transmission path may increase operation speeds.

According to embodiments of inventive concepts, a semiconductor package in which a first semiconductor chip, a supporting plate, a adhesion layer and second to ninth semiconductor chips are mounted on a substrate can be provided. Accordingly, a semiconductor package that is structurally stable may reduce signal transmission paths, and may have a plurality of semiconductor chips mounted thereon. The package may be relatively light, thin, short and small.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of inventive concepts as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A semiconductor package, comprising:
    a substrate;
    a first semiconductor chip on the substrate, wherein the first semiconductor chip comprises a controller;
    a second semiconductor chip on the substrate, wherein the second semiconductor chip comprises a buffer chip;
    a chip stack on the first and the second semiconductor chips and having at least one third semiconductor chip;
    an adhesion layer between the first semiconductor chip and the chip stack and between the second semiconductor chip and the chip stack;
    a first conductive connection, wherein the first conductive connection penetrates the adhesion layer and connects the substrate to the first semiconductor chip, wherein a portion of the first conductive connection is between the first and second semiconductor chips; and
    a second conductive connection, wherein the second conductive connection penetrates the adhesion layer and connects the substrate to the second semiconductor chip, wherein a portion of the second conductive connection is between the first and second semiconductor chips; and
    a support plate between the substrate and the chip stack, wherein the adhesion layer is directly on the first semiconductor chip, the second semiconductor chip, and the support plate;
    wherein the chip stack includes a plurality of third semiconductor chips, wherein the plurality of third semiconductor chips comprises a plurality of memory chips, and wherein a sidewall of the first semiconductor chip is coplanar with a sidewall of a first one of the third semiconductor chips.

2. The semiconductor package according to claim 1, wherein top surfaces of the first semiconductor chip and the second semiconductor chip are formed at a same horizontal level.

3. The semiconductor package according to claim 2, wherein the adhesion layer is in direct contact with a top surface of the first semiconductor chip, a top surface of the second semiconductor chip, and a bottom surface of the chip stack.

4. The semiconductor package according to claim 3, wherein the adhesion layer is in direct contact with the first of the third semiconductor chips, and the first semiconductor chip.

5. The semiconductor package according to claim 2, wherein the second semiconductor chip has a same thickness as the first semiconductor chip.

6. The semiconductor package according to claim 1, wherein a sidewall of the second semiconductor chip is coplanar with a sidewall of the first one of the third semiconductor chips.

7. The semiconductor package according to claim 1, wherein the first of the third semiconductor chips has a greater width than the first semiconductor chip and has a greater width than the second semiconductor chip.

8. The semiconductor package according to claim 7, wherein each of the third semiconductor chips has a same thickness.

9. The semiconductor package according to claim 1, wherein at least a portion of the conductive connection is physically located directly between the second semiconductor chip and the chip stack in a direction perpendicular with respect to a surface of the substrate.

10. The semiconductor package according to claim 1, wherein the conductive connection comprises a wire bond.

11. The semiconductor package of claim 1 wherein the buffer chip is between the controller and the support plate.

12. A semiconductor package, comprising:
    a first semiconductor chip on a substrate;
    a second semiconductor chip on the substrate, the second semiconductor chip being separate from the first semiconductor chip;
    a support plate on the substrate, wherein the second semiconductor chip is between the first semiconductor chip and the support plate;

a chip stack on the first and second semiconductor chips and the support plate and having at least one third semiconductor chip;

an adhesion layer between the first semiconductor chip and the chip stack, between the second semiconductor chip and the chip stack, and between the support plate and the chip stack;

a first conductive connection, wherein the first conductive connection penetrates the adhesion layer and connects the substrate to the first semiconductor chip, wherein a portion of the first conductive connection is between the first and second semiconductor chips; and a second conductive connection, wherein the second conductive connection penetrates the adhesion layer and connects the substrate to the second semiconductor chip, wherein a portion of the second conductive connection is between the second semiconductor chip and the support plate;

wherein the chip stack includes a plurality of third semiconductor chips, wherein a sidewall of the first semiconductor chip is coplanar with a sidewall of a first one of the third semiconductor chips, wherein the adhesion layer is in direct contact with the first and second semiconductor chips and the support plate, and wherein the first conductive connection and the second conductive connection are between the third semiconductor chip and the substrate.

13. The semiconductor package of claim 12 wherein the first semiconductor chip comprises a controller, wherein the second semiconductor chip comprises a buffer chip, and wherein the plurality of third semiconductor chips comprises a plurality of memory chips.

14. The semiconductor package of claim 13 wherein the buffer chip is between the controller and the support plate.

15. The semiconductor package of claim 12 wherein all portions of the first conductive connection and the second conductive connection are in a shadow region of the third semiconductor chip.

16. A semiconductor package, comprising:

a substrate;

a first semiconductor chip on the substrate, wherein the first semiconductor chip comprises a controller;

a second semiconductor chip on the substrate, wherein the second semiconductor chip comprises a buffer chip;

a chip stack on the first and the second semiconductor chips and having at least one third semiconductor chip, wherein the chip stack includes a plurality of third semiconductor chips, wherein a sidewall of the first semiconductor chip is coplanar with a sidewall of a first one of the third semiconductor chips, and wherein the plurality of third semiconductor chips comprises a plurality of memory chips;

an adhesion layer between the first semiconductor chip and the chip stack and between the second semiconductor chip and the chip stack;

a first conductive connection, wherein the first conductive connection penetrates the adhesion layer and connects the substrate to the first semiconductor chip;

a second conductive connection, wherein the second conductive connection penetrates the adhesion layer and connects the substrate to the second semiconductor chip; and a support plate between the substrate and the chip stack, wherein the adhesion layer is directly on the first semiconductor chip, the second semiconductor chip, and the support plate;

wherein the buffer chip is between the controller and the support plate.

* * * * *